United States Patent
Wohlfarth et al.

(10) Patent No.: US 6,329,892 B1
(45) Date of Patent: Dec. 11, 2001

(54) LOW PROFILE, CURRENT-DRIVEN RELAY FOR INTEGRATED CIRCUIT TESTER

(75) Inventors: Paul Dana Wohlfarth, Vernonia; Robert R. Hale, Beaverton; Travis Scott Ellis, Scappoose, all of OR (US)

(73) Assignee: Credence Systems Corporation, Fremont, CA (US)

( * ) Notice: Subject to any disclaimer, the term of this patent is extended or adjusted under 35 U.S.C. 154(b) by 0 days.

(21) Appl. No.: 09/491,080

(22) Filed: Jan. 20, 2000

(51) Int. Cl.$^7$ ........................................... H01H 1/66
(52) U.S. Cl. ................................. 335/151; 361/88
(58) Field of Search ..................... 335/151–154, 335/205–7; 336/200; 361/88–91, 117, 120

(56) References Cited

U.S. PATENT DOCUMENTS

| | | | |
|---|---|---|---|
| 3,560,904 | * 2/1971 | Wilkes | 336/200 |
| 3,614,554 | * 10/1971 | Shield et al. | 336/200 |
| 3,638,156 | * 1/1972 | West | 336/200 |
| 3,745,508 | * 7/1973 | Bruder et al. | 336/192 |
| 3,858,138 | * 12/1974 | Gittleman et al. | 336/136 |
| 4,769,622 | * 9/1988 | Leavitt | 335/154 |
| 4,922,369 | * 5/1990 | Sakatos | 361/88 |

FOREIGN PATENT DOCUMENTS

2035698 * 11/1978 (GB) .
2-10705 * 2/1990 (JP) .

* cited by examiner

*Primary Examiner*—Lincoln Donovan
(74) *Attorney, Agent, or Firm*—Daniel J. Bedell; Smith-Hill and Bedell

(57) ABSTRACT

A relay includes contacts residing within a glass tube. A coil surrounding the tube and a switch are connected in parallel between two terminals of the relay. A current source supplies a current to the coil and switch. When the switch is open, substantially all of the current passes through the coil and the coil produces a sufficient amount of magnetic flux to close the relay's contacts. When the switch closes, it shunts a sufficient amount of the current away from the coil to reduce the magnetic flux it produces below the level needed to keep the contacts closed. The current source is sized so that the coil requires relatively few turns, thereby allowing the relay to be relatively thin. The coil is formed by a conductor embedded in an insulating substrate surrounding the tube.

9 Claims, 6 Drawing Sheets

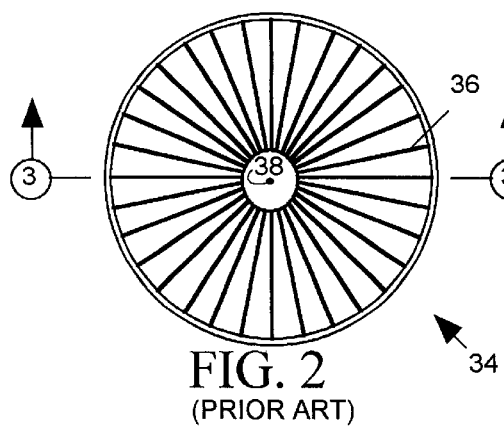
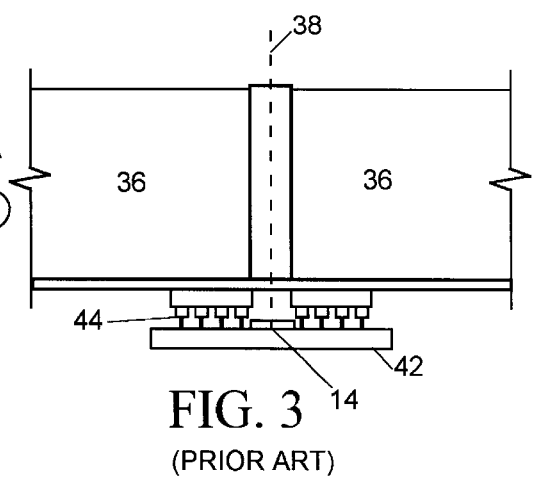
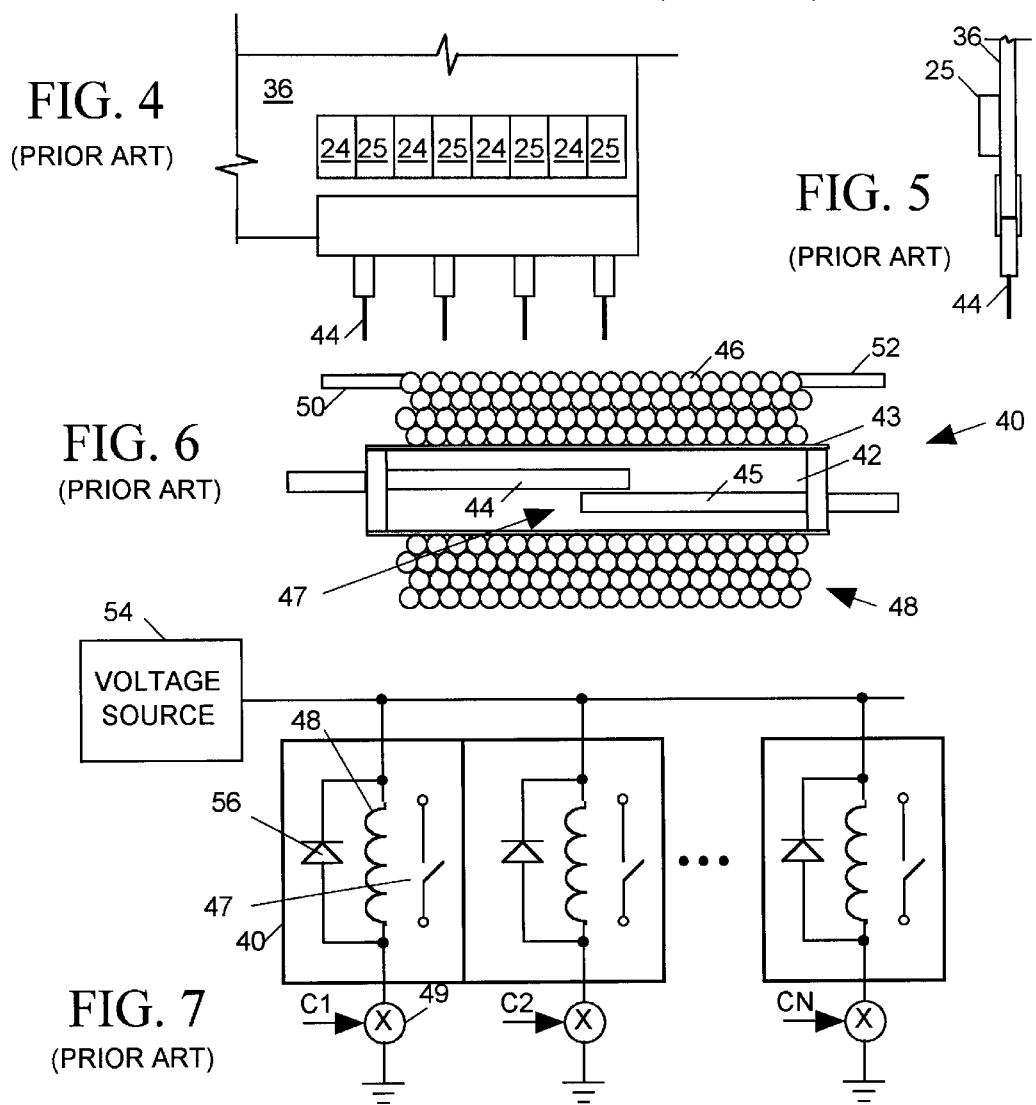

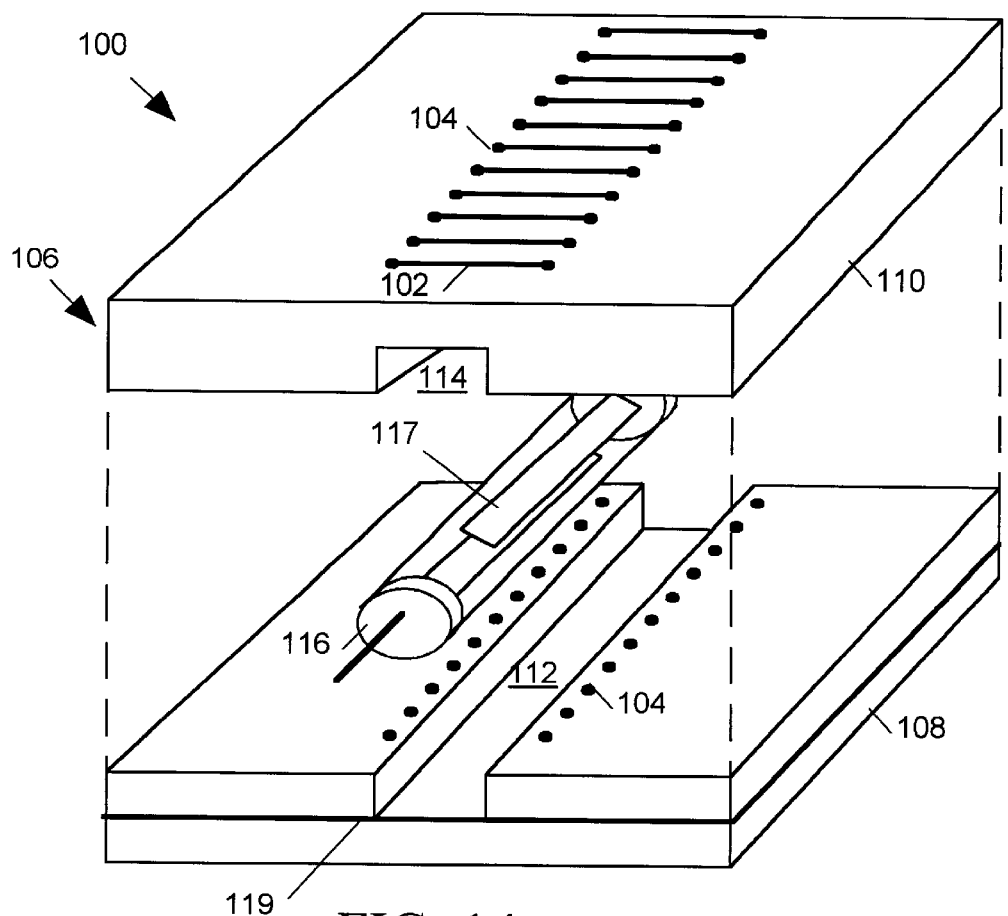
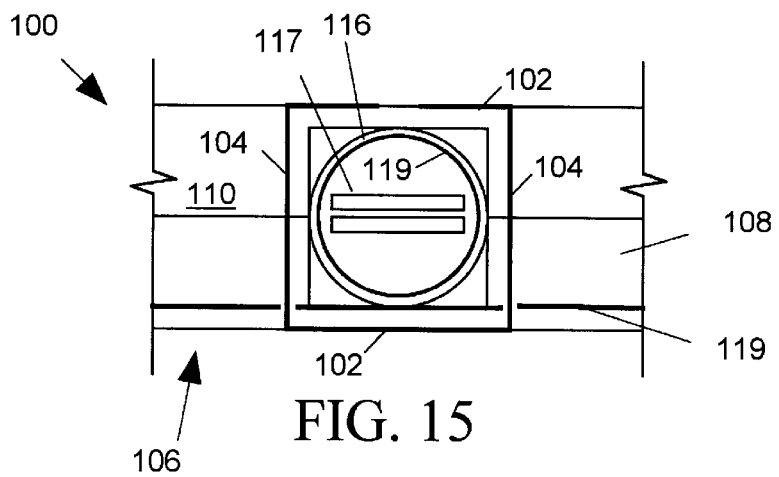

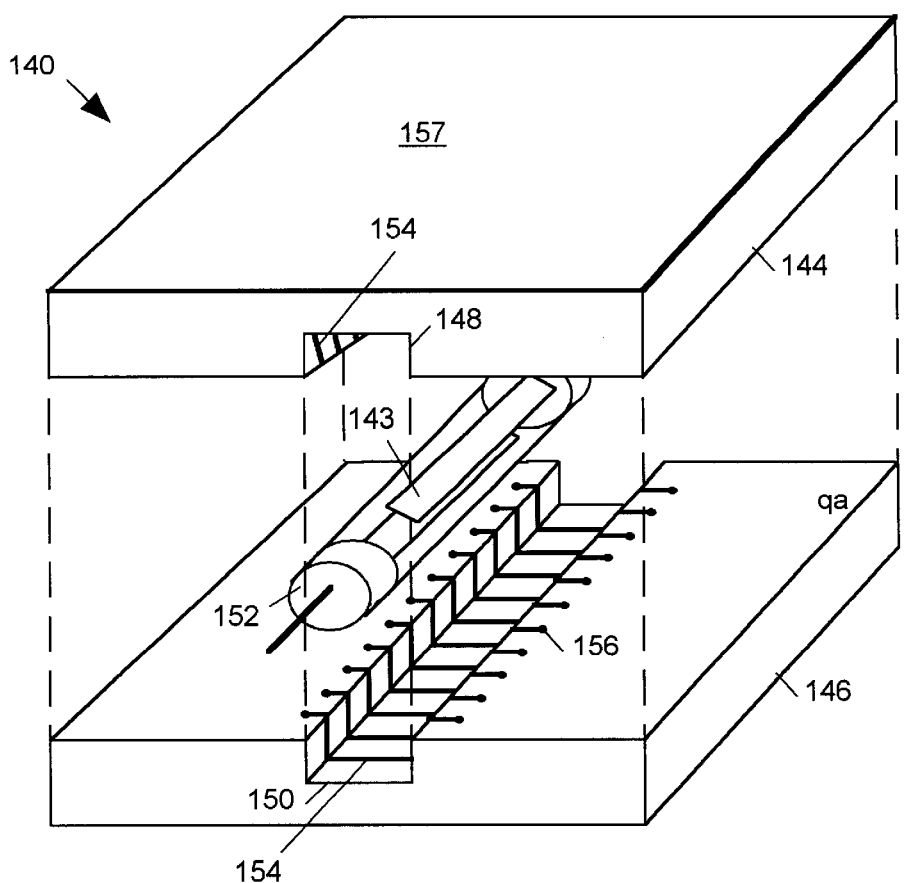
FIG. 18
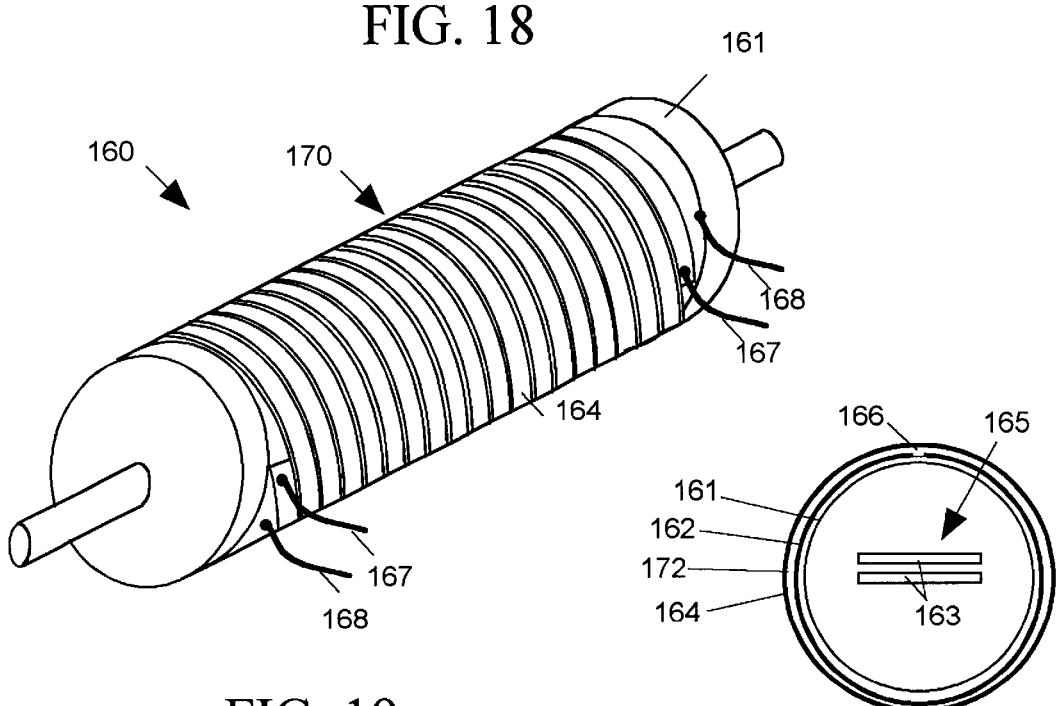
FIG. 19
FIG. 20

LOW PROFILE, CURRENT-DRIVEN RELAY FOR INTEGRATED CIRCUIT TESTER

BACKGROUND OF THE INVENTION

1. Field of the Invention

The present invention relates in general to relays and in particular to a current-driven relay having a low profile for use in routing signals on closely spaced circuits or circuit boards of an integrated circuit tester.

2. Description of Related Art

FIG. 1 is a block diagram of a portion of a typical prior art integrated circuit (IC) tester 10 including a set of channels 12, one for each of several terminals of an IC device under test (DUT) 14. Each channel 12 includes a channel control and data acquisition circuit 16, a comparator 18 and a tristate driver 20. A relay 24 links an input of comparator 18 and an output of driver 20 to a DUT terminal 26. Another relay 25 connects a parametric measurement unit (PMU) 28 within channel 12 to DUT terminal 26. A host computer 30 communicates with the channel circuits 16 of each channel 12 via a parallel bus 32.

Tester 10 can carry out both digital logic and parametric tests on DUT 14. Before starting a digital logic test, the control and data acquisition circuit 16 of each channel 12 closes relay 24 and opens relay 25 to connect comparator 18 and driver 20 to DUT terminal 26 and to disconnect PMU 28 from terminal 26. Thereafter, during the digital logic test, the channel control signal may turn on driver 20 and signal it to send a logic test pattern to DUT terminal 26 when the DUT terminal 26 is acting as a DUT input. When terminal 26 is a DUT output, circuit 16 turns off driver 20 and supplies an "expect" bit sequence to an input of comparator 18. Comparator 18 produces an output FAIL signal indicating whether successive states of the DUT output signal matches successive bits of the expect bit sequence. Circuit 16 either stores the FAIL data acquired during the test for later access by host computer 30 or immediately notifies host computer 30 when comparator 18 asserts the FAIL signal.

PMU 28 includes circuits for measuring analog characteristics of the DUT 14 at terminal 26 such as, for example, the DUT's quiescent current. Before starting a parametric test, the channel control circuit 16 opens relay 24 and closes relay 25 to connect the channel's PMU 28 to DUT terminal 26 and to disconnect comparator 18 and driver 20 from terminal 26. Host computer 30 then programs PMU 28 to carry out the parametric test and obtains test results from the PMU.

Relays 24 and 25 are normally preferred over solid state switches for routing signals between DUT 14, PMU 28, driver 20 and comparator 18 because a relay has a very low loss that does not substantially influence test results. We would like to position comparator 18, driver 20, relays 24 and 25, and circuit 16 as close as possible to DUT terminal 26 to minimize the signal path lengths between terminal 26, comparator 18 and driver 20. When the signal paths are too long, the signal delays they cause can make it difficult or impossible to provide the signal timing needed to properly test DUT 14, particularly when the DUT operates at a high speed. Thus to minimize signal path distances we want to use relays 24 and 25 that are as short as possible and which can be reached via short signal paths.

In some prior art testers, one or more channels 12 are implemented on each of a set of printed circuit boards ("pin cards") that are mounted in a cylindrical chassis to form a test head. FIG. 2 illustrates a simplified plan view of a typical test head 34. FIG. 3 is a partial sectional elevation view of the test head 34 of FIG. 2. FIGS. 4 and 5 are expanded front and side elevation views of a lower portion of one of a set of pin cards 36 mounted within test head 34. Pin cards 36 are radially distributed about a central axis 38 of test head 34 and positioned above an integrated circuit device under test (DUT) 14 mounted on a printed circuit board, "load board" 42. A set of pogo pins 44 provide signal paths between relays 24, 25 mounted on pin cards 36 and contact points on the surface of load board 42. Microstrip traces on load board 42 connect the contact points to terminals of DUT 14.

Relays 24, 25 are mounted near the lower edges of each pin card 36 as close as possible to central axis 38 to minimize the signal path distance to DUT 14. However from FIG. 2 we can see that the space between pin cards 36 is relatively limited near axis 38. Thus in order to position relays 24, 25 close to axis 38 we want to use relays that are relatively thin.

FIG. 6 is a simplified sectional elevation view of a typical relay 40. Relay includes a glass tube 42 containing a pair of conductive reeds 44, 45 that serve as the relay's contacts 47. A wire 46 wraps many turns around tube 42 to form a coil 48. Reeds 44, 45 are normally spaced apart, but when a voltage is applied across opposite leads 50, 52 of coil 48, magnetic flux produced by the coil causes reeds 44, 45 to contact one another so that a current may flow through the relay contacts 47. A conductive sheath 43 partially surrounds tube 42 to provide a ground surface. The spacing between reeds 44, 45 and shield 43 influences the characteristic impedance of the transmission line formed by reeds 44 and 45 when they are in contact.

The magnetic force produced by coil 48 on reeds 44, 45 is proportional to the product of the magnitude of the current passing through coil 48 and the number of turns of coil about tube 42. A large number of coil turns is provided to minimize the amount of current needed to operate relay 40. However the large number of turns contributes to the thickness of relays; a relay's coil typically contributes more than half the thickness of the relay.

FIG. 7 is a schematic diagram a typical circuit for driving coils of a set of N relays 40. One end of each relay's coil 48 is connected to a voltage source 54 while the other end of the relay's coil is connected to ground through one of a set of N switches 49 controlled by one of control signals C1–CN. For example when a control signal C1 turns on one of switches 49, the current passes through relay coil 48 thereby causing the relay's contacts 47 to close. When control signal C1 turns off switch 49, current stops passing though coil 48 and allows contacts 47 to open.

When switch 49 opens, the magnetic field produced by coil 48 collapses producing a transient voltage spike across coil 48 that is limited by a diode 56 connected across the coil. Without diode 56 the voltage spike would pass though voltage source 54 and appear as undesirable noise in other circuits receiving power from voltage source 54. However while diode 56 reduces the amount of switching noise produced by relay 40, it also adds to the bulk of the relay.

What is needed is a low profile relay for mounting on a printed circuit board wherein the relay occupies relatively little space above the circuit board and which can be packed densely on a circuit board.

SUMMARY OF THE INVENTION

A relay in accordance with one aspect of the invention includes contacts residing within a glass tube. A coil surrounding the tube and a switch are connected in parallel between two terminals of the relay. A current source supplies a current to the coil and switch. When the switch is open, all of the current passes through the coil and the coil produces a sufficient amount of magnetic flux to close the relay's contacts. When the switch closes, it shunts a sufficient amount of the current away from the coil to reduce the magnetic flux it produces below the level needed to keep the contacts closed.

Since the total amount of current passing through the relay coil and switch remains constant regardless of whether the relay contacts are opened or closed, relay switching does not produce substantial voltage transients in the power supply. Thus the relay does not require a diode across the coil to reduce such current transients.

In accordance with another aspect of the invention, the magnitude of the current produced by the current source is large enough to produce the required magnetic flux in the relay coil when relay has only a relatively few turns. With a relatively small coil, the relay has a low profile.

In accordance with a first embodiment of the invention, the coil is formed by insulated wire wrapped in a single layer around the relay tube. The wire has a rectangular cross-section to allow successive turns to be tightly packed to minimize coil thickness.

In accordance with a second embodiment of the invention, the coil is formed by conductors embedded in a sheet of flexible substrate wrapped around the tube.

In accordance with a third embodiment of the invention the relay tube is embedded in a recess formed between adjacent layers of a circuit board and the coil is formed by conductors and vias formed on and within the circuit board layers.

In accordance with a fourth embodiment of the invention, the relay tube is embedded in a recess of a circuit board and covered with a sheet of flexible insulating material containing embedded conductors. A lower portion of the relay's coil is formed by conductors and vias in the circuit board and an upper portion of the relay's coil is formed by the conductors embedded in the sheet of flexible insulating material.

In accordance with a fifth embodiment of the invention, the relay tube is embedded between adjacent layers of semiconductor material. The relay's coil is formed by conductors formed on facing surfaces of the semiconductor layers.

In accordance with a sixth embodiment of the invention, the coil is formed by depositing a conductive coating on a surface of the relay's tube and then removing parts of the coating so that the coating forms a spiral-shaped coil around the tube.

It is accordingly an object of the invention to provide a low profile relay for mounting on a printed circuit board wherein the relay occupies relatively little space above the circuit board.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

FIG. 2 is a simplified plan view of a test head of a typical prior art integrated circuit tester;

FIG. 3 is a partial sectional elevation view of the prior art test head of FIG. 2.

FIGS. 4 and 5 are expanded front and side elevation views, respectively, of a lower portion of one of a set of pin cards mounted within the test head of FIGS. 1 and 2;

FIG. 6 is a simplified sectional elevation view of a typical prior art relay;

FIG. 7 is a schematic diagram illustrating a prior art circuit for driving a set of N prior art relays;

FIGS. 14 and 15 are exploded perspective and sectional elevation views, respectively of a relay in accordance with a third embodiment of the invention;

FIG. 18 is an exploded perspective view of relay in accordance with a fifth embodiment of the invention; and FIGS. 19 and 20 are perspective and sectional elevation views, respectively of a relay in accordance with a sixth embodiment of the invention.

DESCRIPTION OF THE PREFERRED EMBODIMENT(S)

Figure 1:
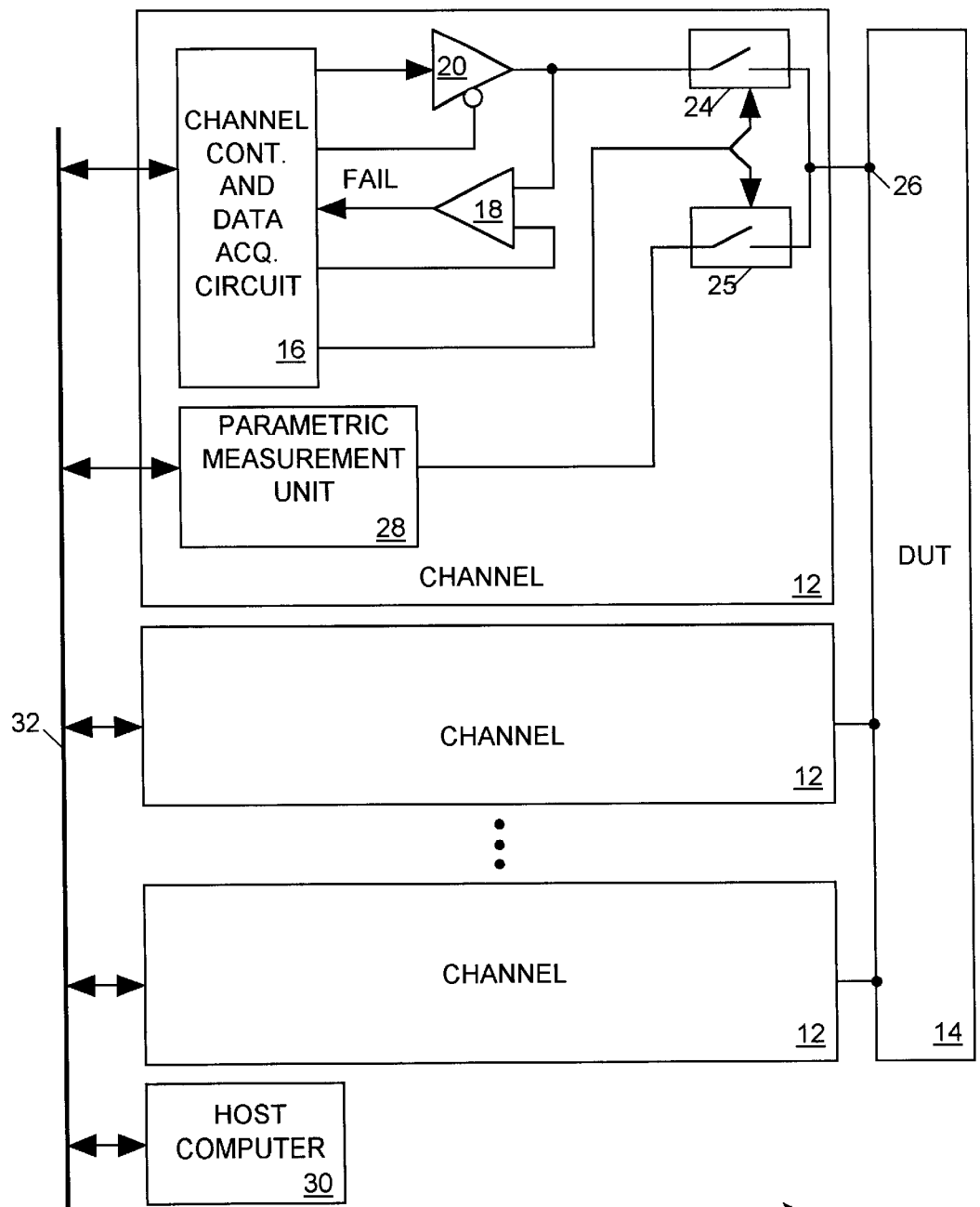
FIG. 1 illustrates in block diagram form portions of a typical prior art integrated circuit (IC) tester.

The present invention relates to a low profile relay suitable for replacing thicker prior art relays 24 and 25 of prior art integrated circuit tester 10 illustrated in FIG. 1. Prior art relays 24 and 25 selectively link circuits 16 and 28 of channels 12 to terminals 26 of an integrated circuit device under test (DUT) 14. As illustrated in FIGS. 2–5, the circuits forming channels 12 are implemented on a set of printed circuit boards ("pin cards") 36 that are radially distributed about a central axis 38 within a test head 34. Relays 24 and 25 are mounted in the ends of pin cards 36 near DUT 14 to minimize signal path lengths. However since there is relatively little space on and between the pin cards in these areas, it is beneficial to provide small relays that occupy as little surface area as possible on the pin cards 36 and that occupy relatively little space between pin cards 36. By providing small, low profile relays, we can position them closer to DUT 14, thereby further reducing signal path lengths. Alternatively we can increase the number of pin cards 36 that can be mounted in the test head 34, thereby allowing IC tester 10 to access a larger number of DUT terminals. Low profile relays are also less likely to be bumped and damaged when pin cards 36 are installed in or removed from test head 34.

A typical relay includes a coil surrounding a pair of conductive reeds forming the relay contacts. When a current passes through the coil, the coil produces a magnetic flux that forces the reeds to contact one another so that a signal can pass though the relay contacts. The magnetic force generated by the coil increases with the product of the magnitude of the current passing through the coil and the number of turns of the coil about the contacts. In order to limit the amount of current needed, relays typically employ a large number of coil turns. However a large number of coil turns make the relays relatively thick. A relay in accordance with the present invention uses more current so that it needs fewer coil turns to provide the necessary magnetic flux to operate the relay contacts. With few coil turns, the relay is relatively thin.

Figure 8:
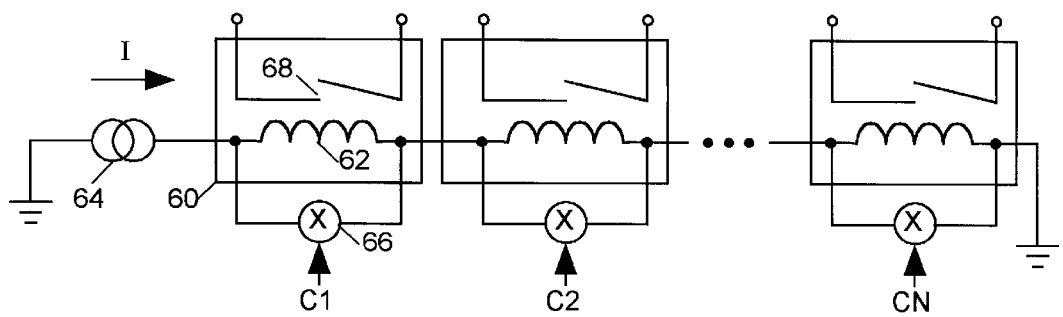
FIG. 8 is a schematic diagram of a circuit for driving a set of N relays in accordance with the present invention.

FIG. 8 is a schematic diagram illustrating a set of N relays 60. In accordance with one aspect of the invention, coils 62 of relays 60 are connected in series and driven by a current source 64. A low impedance switch 66 is connected in parallel with each relay's coil 62. Switch 66 may be mounted either proximate to or remotely from the coil 62. When the switch 66 of a relay 60 is off, all of the current I produced by source 64 passes through the relay's coil 62. The magnetic flux produced by coil 62 causes the relay's contacts 68 to close (or open in the case of "normally closed" relay). When one of control signals C1–CN turns on the switch 66 of a relay 60, the switch 60 shunts most of the current around the relay's coil 62, thereby reducing the magnetic flux produced by the coil and allowing contacts 68 to open.

Since relays 60 of FIG. 8 have relatively fewer coils than the prior art relays 40 of FIG. 7, they draw more current. However while the maximum amount of current that the voltage source 54 in the prior art relay circuit of FIG. 7 must provide is equal to the sum of currents drawn by all N relays 40, the maximum amount of current source 64 in the relay circuit of FIG. 8 must supply is equal to the amount of current that only one relay 60 draws since the same current passes through all relays 60. Thus as the number N of relays increases, the maximum amount of current voltage source 54 of FIG. 6 must provide increases while the amount of current source 64 must supply does not.

Referring to prior art relay circuit of FIG. 7, when a relay's switch 49 opens, the magnetic field produced by the relay's coil 48 collapses and produces a transient voltage spike across the coil. Without a diode 56 connected across coil 48, the transient voltage would pass though voltage source 54 and would appear as undesirable noise in every other circuit that receives power from voltage source 54. Although diode 56 is provided to limit the voltage transient, that diode adds to the bulk of the relay. In the improved relay circuit of FIG. 8, switch 66 limits the voltage transients produced by the collapse of the magnetic field in coil 62; a diode is not needed.

In the prior art system of FIG. 7 the amount of current provided by voltage source 54 depends on the number of relay control switches 49 that are currently turned on. Thus the current output of voltage source 54 changes whenever any switch 49 opens or closes. This variation in current can also cause noise in circuits elsewhere in the tester that are driven by voltage source 54. Since the current I supplied by current source 64 of FIG. 8 is constant and unaffected by relay state changes, no such noise is produced.

Figure 9:
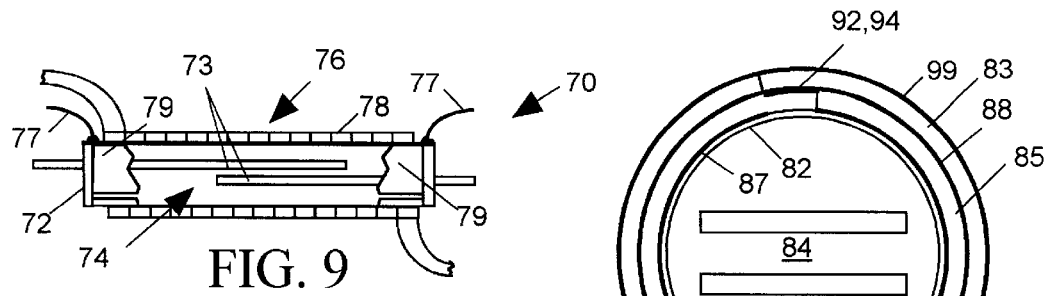
FIG. 9 illustrates a sectional side elevation view of a relay in accordance with a first embodiment of the invention.

FIG. 9 illustrates a sectional view of a relay 70 in accordance with a first embodiment of the invention. Relay 70 includes a glass tube 72, relay contacts 74 within tube 72 formed by reeds 73, and a coil 76 formed by several turns of insulated copper wire 78 surrounding tube 72. Since coil 76 conducts a relatively large current, only a single layer of turns of wire 76 is required. Thus coil 76 adds relatively little thickness to relays 70. In accordance with the invention wire 78 has a rectangular, rather than a circular, cross-section so that there is no wasted space between coil turns. A conductive shield 79 partially surrounding tube 72 acts as a ground surface for the transmission line formed by reeds 73. The spatial arrangement of shield 79 and reeds 73 influences the transmission line impedance. Shield 79 may be formed, for example, by a sheet of conductive foil wrapped partially around tube 72 or by depositing a layer of metal directly on the outer surface of tube 72. Shield 79 may be grounded through leads 77 at opposite ends of relay 70 that are bonded to the shield. Tube 72 may have a round, rectangular or other shaped cross-section.

Figure 10:
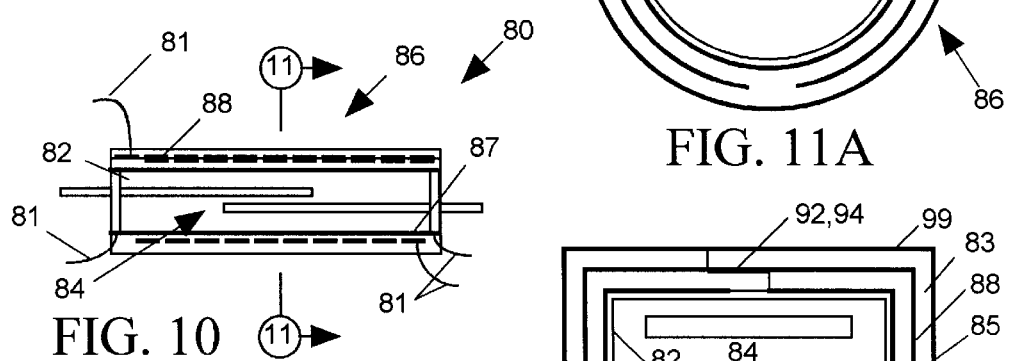
FIG. 10 is a sectional plan view of a relay in accordance with a second embodiment of the invention.
Figure 11A:
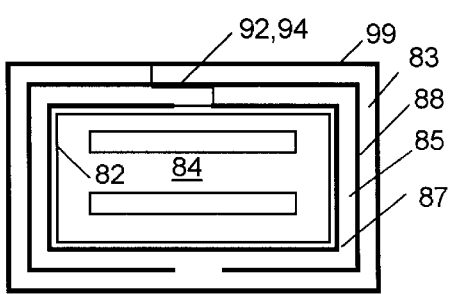
FIGS. 11A and 11B are alternative sectional elevation vies of the relay of FIG. 10.
Figure 11B:
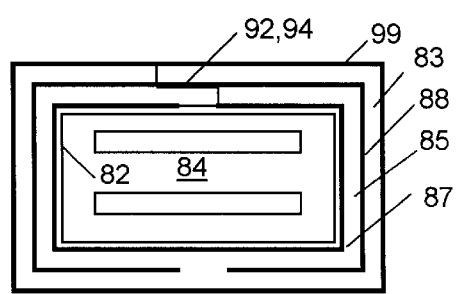

FIG. 10 is a sectional plan view and FIGS. 11A and 11B are alternative sectional elevation views of a relay 80 in accordance with a second embodiment of the invention. Relay 80 has a coil assembly 86 formed by a "flex circuit" comprising conductors 88 embedded in a sheet of flexible insulating material 83,85. The flex circuit coil assembly 86 is wrapped around a glass tube 82 containing reeds 84.

Figure 12:
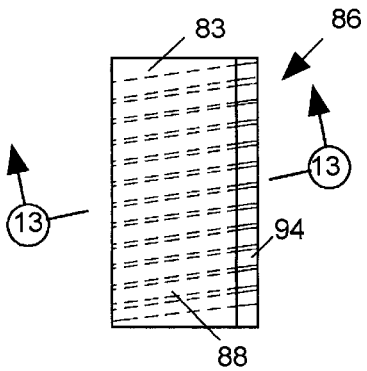
FIGS. 12 and 13 are plan and sectional elevation views, respectively, of flex circuit forming a coil assembly of the relay of FIG. 10.
Figure 13:
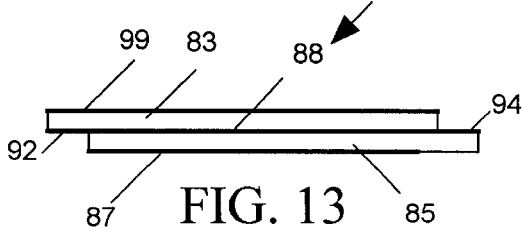

FIGS. 12 and 13 are plan and sectional elevation views of flex circuit forming coil assembly 86 before it is wrapped around tube 82. Referring to FIGS. 10–13, coil assembly 86 is implemented by a flex circuit including flexible, insulating plastic substrate layers 83 and 85 and a set of flexible conductors embedded between insulating material layers 83 and 85. The two flexible layers 83 and 85 of assembly 86 are offset so that conductors 88 are exposed on both ends 92 or 94 of coil assembly 86. When the assembly 86 is wrapped around tube 82, ends 92 and 94 overlap so that ends of adjacent conductors 88 contact with one another, thereby forming a continuous coil about tube 82. The contact between portions of conductors 88 may be secured with glue or other suitable fastening means. Coil assembly 86 also includes a conductive layer 87 below layer 94 that partially surrounds tube 82 to provide a shield for the transmission line formed by reeds 84. Leads 81 bonded to shield 87 provide access to opposite ends of coil 86 and to opposite ends of shield 87. An optional outer layer 99 of ferrous or other material capable of conducting magnetic flux may be added to assembly 86 to act as a magnetic flux shield. Tube 82 may have a round cross-section as illustrated in FIG. 11A or may have a rectangular or other shaped cross-section as illustrated in FIG. 11B FIGS. 14 and 15 are exploded perspective and sectional elevation views, respectively, of a relay 100 in accordance with a third embodiment of the invention. Relay 100 includes a glass tube 116 containing reeds 117 and a coil assembly formed by traces 102 and vias 104 formed on and in a printed circuit board 106. Circuit board 106 includes a lower substrate layer 108 and an upper substrate layer 110 having adjacent recesses 112 and 114 for receiving relay tube 116. conductive layer 119 embedded in lower substrate layer 108 provides a ground surface for the transmission line formed by reeds 117. Alternatively a shield partially surrounding tube 116 (similar to shield 79 of FIG. 9) may provide the ground surface for the transmission line. Tube 117 may have a round cross-section as illustrated in FIG. 15 or may optionally have a rectangular or other cross-section.

Figure 16:
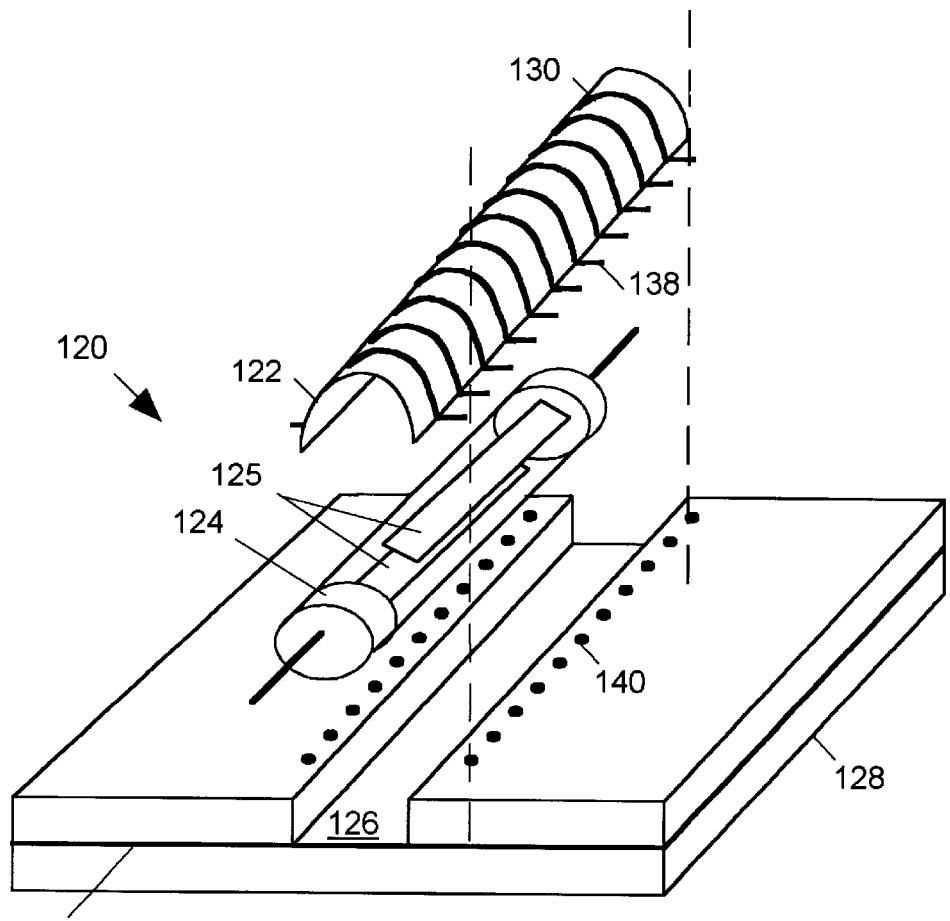
FIGS. 16 and 17 are exploded perspective and sectional elevation views, respectively, of a fourth embodiment of a relay in accordance with the invention.
Figure 17:
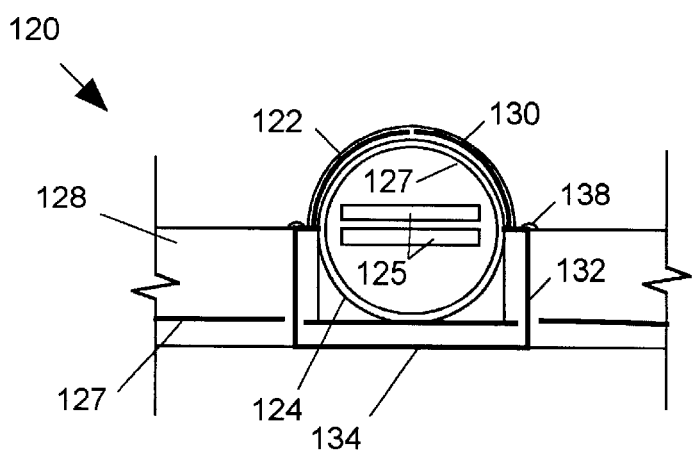

FIGS. 16 and 17 are exploded perspective and sectional elevation views, respectively, of a relay 120 in accordance with a fourth embodiment of the invention including a glass tube 124 containing a pair of relay reeds 125. Tube 124 is set into a recess 126 within circuit board 128 and covered with a flex circuit 122 comprising conductors 130 embedded in a sheet of flexible insulating material. Conductors 130 form an upper portion of a coil surrounding tube 124 while vias 132 through circuit board 128 and traces 134 on the underside of circuit board 128 form a lower portion of the coil. Exposed ends of conductors 130 are bonded to pads 138 on the surface of circuit board 128, and vias 132 link pads 138 to the traces 134 on the under side of circuit board 128. A conductive layer 127 embedded in circuit board 128 acts as a ground surface for the transmission line formed by reeds 125. Alternatively a shield partially surrounding tube 124 (similar to shield 79 of FIG. 9) may provide the transmission line ground surface. Tube 122 may have a round cross-section as illustrated in FIG. 17 or may optionally have a rectangular or other cross-sectional shape.

FIG. 18 is an exploded perspective view of a relay 140 in accordance with a fifth embodiment of the invention wherein a relay tube 152 containing reeds 143 is embedded between an upper layer 144 and a lower layer 146 of semiconductor material. Recesses 148 and 150 etched into the lower surface of upper layer 144 and the upper surface of lower layer 146 receive relay tube 152. A coil surrounding tube 152 is formed by a set of traces 154 formed on the upper surface of layer 146 and the lower surface of layer 148. Contacts 156 at the ends of traces 154 on the upper surface of lower layer 146 mate with similar pads (not shown) on the under surface of upper layer 144 to provide electrical continuity between sections of the coil formed by traces 154. A conductive layer 157 formed on top of semiconductor layer 144 acts as a ground surface for the transmission line formed by reeds 143. A metallic sheath can alternatively be formed on the inner or outer surface of tube 152 to act as a ground surface for the transmission line.

FIGS. 19 and 20 are perspective and sectional elevation views of a relay 160 in accordance with a sixth embodiment of the invention. Relay 160 includes a glass tube 161 containing relay reeds 163 forming the relay's contacts 165. A shield 162 partially surrounding tube 161 is formed by depositing a layer of conductive material such as copper on tube 161 and then creating a small lengthwise slot 166 in the metal layer, for example by etching, mechanically cutting or laser trimming. An insulating layer 172 of material (suitably polyimide) is then deposited on shield layer 162. Another conductive layer 164 (suitably copper) is then formed over insulating layer 172. Conductive layer 164 is then etched, laser trimmed or mechanically cut to create a spiral-shaped coil 170 surrounding tube 161. Leads 167 are bonded to opposite ends of coil 170 to provide control signal access to the coil and leads 168 are bonded to opposite ends of shield 162 to provide paths to ground. Leads 167 and 168 may be bonded to coil 170 and shield 161 for example by solder, conductive adhesive, welds or clamps. To reduce space above a circuit board, relay 160 can be partially or fully embedded in a recess within the circuit board. Tube 162 may have a round cross-section as illustrated in FIG. 20 or may optionally have a rectangular or other cross-sectional shape.

Thus has been shown and described various embodiments of a low-profile relay in accordance with the invention suitable for use on circuit boards mounted in the test head of an integrated circuit tester. While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A relay responsive to an input control signal, the relay comprising:
   a tube;
   conductive contacts residing within said tube;
   a current source for generating an output current;
   a coil assembly surrounding the tube and having a first terminal connected to said current source and having a second terminal; and
   a switch external to the tube and connected across said first and second terminals for opening when the input control signal is of a first state and for closing when the input control signal is of a second state,
   wherein when said switch is open, substantially all of the current generated by said current source passes through the coil assembly,
   wherein which the switch is closed, the switch shunts a substantial portion of the current generated by said current source away from the coil assembly,
   wherein the coil assembly produces a magnetic flux of first magnitude when substantially all of the current generated by the current source passes through the coil assembly, and produces the magnetic flux of second magnitude lesser than the first magnitude when the switch shunts the substantial portion of the current generated by said current source away from the coil assembly, and
   wherein the conductive contacts respond to the magnetic flux by contacting one another when the magnetic flux is one of said first and second magnitudes and by separating from one another when the magnetic flux is another of said first and second magnitudes.

2. The relay in accordance with claim 1 wherein said coil assembly comprises:
   an insulated wire wrapped around said tube to form a plurality of coil turns, said wire having a rectangular cross-section.

3. The relay in accordance with claim 1 wherein said coil assembly comprises:
   an insulating substrate surrounding said tube; and
   a coil having multiple turns attached to said insulating substrate and surrounding said tube.

4. The relay in accordance with claim 3
   wherein said insulating substrate comprises a sheet of flexible insulating material having first and second ends,
   wherein said coil comprises a plurality of conductors embedded in said sheet of flexible insulating material, said conductors having exposed portions at said first and second ends of said sheet of flexible insulating material, and
   wherein said sheet of flexible insulating material is wrapped around said tube such that the exposed portions of said conductors contact one another and such that said conductors form said coil.

5. The relay in accordance with claim 3
   wherein said insulating substrate comprises adjacent first and second circuit board layers, said tube being positioned therebetween;
   wherein said coil comprises conductors formed on said first and second circuit board layers; and
   wherein said coil further comprises vias formed in said first and second circuit board layers, said conductors and vias being interconnected to provide a coil having multiple turns surrounding said tube.

6. The relay in accordance with claim 3
   wherein said insulating substrate comprises a circuit board and a sheet of flexible insulating material, said tube being positioned between said circuit board and said sheet of flexible insulating substrate, and
   wherein said coil comprises first conductors formed on said circuit board and second conductors embedded in said sheet of flexible insulating material, said first and second conductors being interconnected to form said coil.

7. The relay in accordance with claim 3 wherein said insulating substrate comprises:

adjacent first and second layers of semiconductor material, said tube being positioned therebetween;

and wherein said coil comprises interconnected conductors formed on said first and second semiconductor layers.

8. The relay in accordance with claim 3 wherein said insulating substrate is deposited on said tube and wherein said coil comprises conductive material formed on said insulating substrate.

9. The relay in accordance with claim 1 wherein said tube has a rectangular cross-section.

* * * * *